(12) United States Patent
Shen

(10) Patent No.: US 8,070,200 B2
(45) Date of Patent: Dec. 6, 2011

(54) APPARATUS FOR PICKING UP OPTICAL ELEMENT

(75) Inventor: Hung-Tsan Shen, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 283 days.

(21) Appl. No.: 12/467,290

(22) Filed: May 17, 2009

(65) Prior Publication Data
US 2009/0289466 A1 Nov. 26, 2009

(30) Foreign Application Priority Data
May 26, 2008 (CN) .......................... 2008 1 0301784

(51) Int. Cl.
*A47J 45/00* (2006.01)

(52) U.S. Cl. .......................................... 294/64.1; 294/2

(58) Field of Classification Search ............. 294/2, 64.1; 901/40
See application file for complete search history.

(56) References Cited

U.S. PATENT DOCUMENTS

| 4,627,785 | A | * | 12/1986 | Monforte | 414/730 |
| 4,723,353 | A | * | 2/1988 | Monforte | 483/10 |
| 4,950,011 | A | * | 8/1990 | Borcea et al. | 294/2 |
| 5,575,059 | A | * | 11/1996 | Muraoka et al. | 29/740 |
| 6,152,507 | A | * | 11/2000 | Pirker | 294/64.3 |
| 7,059,045 | B2 | * | 6/2006 | Lu et al. | 29/840 |
| 2003/0030293 | A1 | * | 2/2003 | Kashiwazaki et al. | 294/64.1 |

* cited by examiner

*Primary Examiner* — Saul Rodriguez
*Assistant Examiner* — Stephen Vu
(74) *Attorney, Agent, or Firm* — Altis Law Group, Inc.

(57) ABSTRACT

An apparatus comprises a suction device and two positioning members. The suction device comprises a suction body and a suction nozzle. The suction body is in communication with the suction nozzle and is configured for providing a pressure below atmospheric pressure to make the suction nozzle picking up the optical element. The two positioning members movably mounted on two opposite sides of the suction body and are configured for moving towards each other to move the optical element picked up by the suction nozzle to a predetermined fixed position relative to the suction device.

17 Claims, 6 Drawing Sheets

ABSTRACT# APPARATUS FOR PICKING UP OPTICAL ELEMENT

BACKGROUND

1. Technical Field

The present disclosure generally relates to apparatuses for assembling lens modules, particularly to an apparatus for picking up an optical element.

2. Description of Related Art

The ongoing development in microcircuitry and multimedia technology has made digital cameras popular and put into widespread use. High-end portable electronic devices, such as mobile phones and personal digital assistants (PDAs), are being developed to be increasingly multi-functional. Nowadays, some of these portable electronic devices are equipped with a camera module.

The camera module generally includes a lens module, which includes a lens barrel and a plurality of optical elements mounted in the lens barrel. The optical elements may for example include lenses, spacers, and an infrared-cut (IR-cut) filter.

A typical method for assembling the lens module includes securing a lens barrel on an assembly station, grasping an optical element, and mounting the optical element into the lens barrel, one by one with an optical element grasping member (e.g. a suction nozzle). The optical element-grasping member, the optical elements, and the lens barrel must be coaxial. If the optical element-grasping member is not coaxial with the optical elements when mounting the optical elements, eccentricity may occur between the optical elements and the lens barrel, thereby adversely affecting the optical performance of the lens module.

Therefore, an improved apparatus is desired to overcome the above-described deficiencies.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Figure 1:
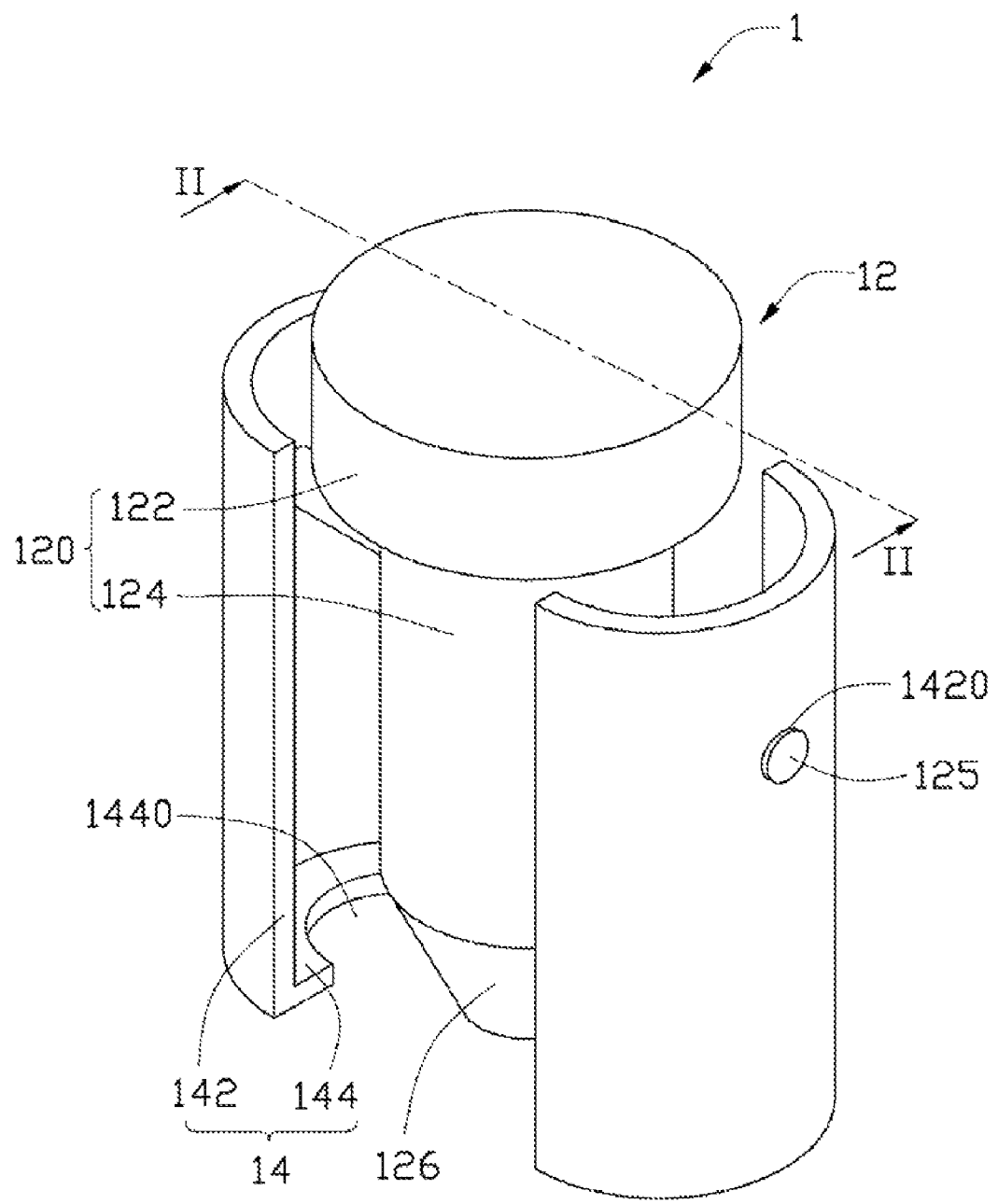
FIG. 1 is a schematic view of an apparatus configured for picking up an optical element, in accordance with a first embodiment.
Figure 2:
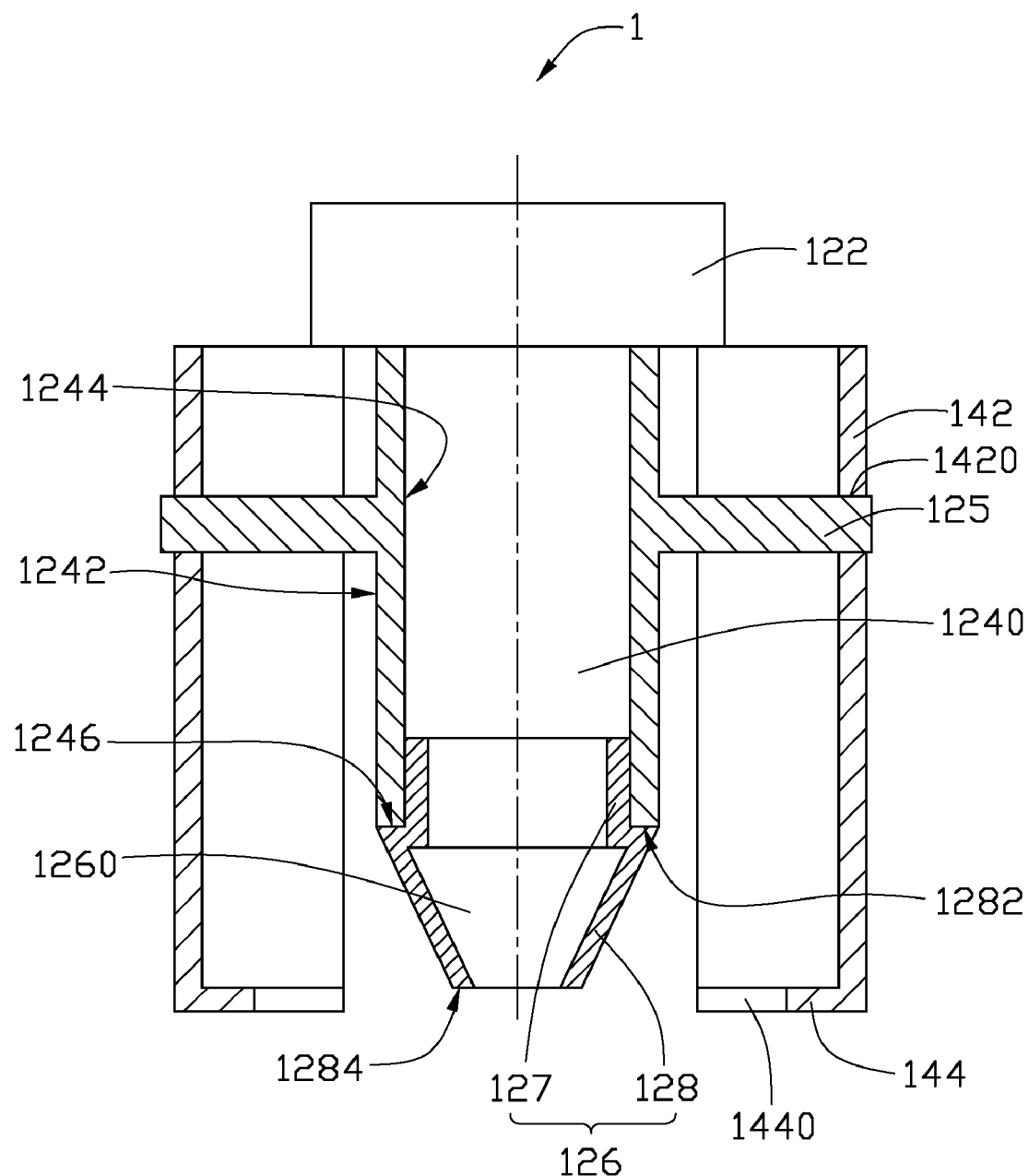
FIG. 2 is a sectional view of the apparatus of FIG. 1, taken along line II-II.

Referring to FIG. 1, an apparatus 1 configured for picking up an optical element (e.g. a lens, a spacer, a filter, etc.) and adjusting the position of the optical element, in accordance with a first embodiment, is shown. The apparatus 1 includes a suction device 12 and two positioning members 14.

The suction device 12 includes a suction body 120 and a suction nozzle 126. The suction body 120 includes a suction pump 122 and a suction pipe 124 in communication with the suction pump 122. The suction pump 122 can be a vacuum pump, and is configured for providing an air pressure below atmospheric pressure to the suction pipe 124. That is, the suction pump 122 can remove air from the suction pipe 124, thereby lowering the air pressure in the suction pipe 124 relative to atmospheric pressure. The suction pipe 124 is cylindrical, and has an outer surface 1242, an inner surface 1244 and a connecting surface 1246 connected between the outer surface 1242 and the inner surface 1244. The inner surface 1244 forms an elongated space 1240 communicating with the suction pump 122. Two guiding poles 125 extend from opposite sides of the outer surface 1242 of the suction pipe 124 along a direction perpendicular to a central axis of the suction pipe 124.

The suction nozzle 126 is detachably assembled on a distal end of the suction pipe 124, and is coaxial with the suction pipe 124. The suction nozzle 126 defines a cavity 1260, which is in communication with the elongated space 1240 of the suction pipe 124. Therefore, if the suction pump 122 pumps, an air pressure in the suction pipe 124 and suction nozzle 126 is lower than atmospheric pressure, and then the suction nozzle 126 can pick up an optical element near or in contact with the suction nozzle 126 due to atmospheric pressure.

The suction nozzle 126 includes an engaging portion 127 and a grasping portion 128 connected with the engaging portion 127. A central axis of the engaging portion 127 is coaxial with a central axis of the grasping portion 128. The engaging portion 127 is cylindrical, received in the elongated space 1240, and engages with the inner surface 1244 of the suction pipe 124 by interference fit, in the illustrated embodiment. The grasping portion 128 has a shape like a conical frustum. The longest outer diameter of the grasping portion 128 is equal to the outer diameter of the suction pipe 124. The grasping portion 128 has a flange surface 1282 and a grasping surface 1284 at two opposite sides thereof. The flange surface 1282 is in contact with the connecting surface 1246 of the suction pipe 124. The grasping surface 1284 is configured to be in contact with an optical element. The cavity 1260 is a through hole formed by the engaging portion 127 and the grasping surface 1284 of the grasping portion 128. Thus, when the suction pump 122 works and the grasping surface 1284 is in contact with the optical element, the suction nozzle 126 can pick up the optical element readily.

Two positioning members 14 are movably assembled on opposite sides of the suction pipe 124, and are equidistantly spaced from the central axis of the suction device 12. The two positioning members 14 can move towards each other to the suction pipe 124, and can form barrel-like space when they are in contact with each other. In detail, each of the two positioning members 14 includes a main portion 142 and a guiding portion 144. Each main portion 142 is a long bent plate having a semi-circular shaped cross section. A radius of curvature of each of the main portions 142 is about equal to a radius of curvature of the outer surface 1242 of the suction pipe 124, and a central axis of the two main portions 142 is coaxial with the central axis of the suction pipe 124. In other words, each of the main portions 142 can fittingly engage with half of the columnar shaped suction pipe 124. Each of the main portions 142 has to through hole 1420 corresponding to the guiding poles 125. Thus, the main portions 142 can be disposed on the guiding poles 125, respectively, and can move relative to the suction pipe 124 along the guiding poles 125 correspondingly.

Each of the guiding portions 144 is a semi-circular shaped plate extending from a distal end of the respective main portion 142. Specifically, a distance between each of the guiding portions 144 and the respective through hole 1420 is equal to or larger than a distance between the grasping surface 1284 and the guiding poles 125. In other words, the guiding portions 144 are disposed at a position lower than the grasping surface 1284. The guiding portions 144 each define a semi-circular recess 1440 in a central portion thereof. Each of the recesses 1440 corresponds to half of an optical element, therefore, when the two positioning members 14 are driven to be in contact with each other, the two recesses 1440 can form a receiving space to fittingly receive and guide the optical element grasped by the grasping portion 128. That is, the optical element grasped by the grasping portion 128 can be aligned to a predetermined fixed position relative to the suction device 12.

It is noted that the two positioning members 14 can be driven by two motors, such as air cylinders, and hydraulic cylinders.

Figure 3:
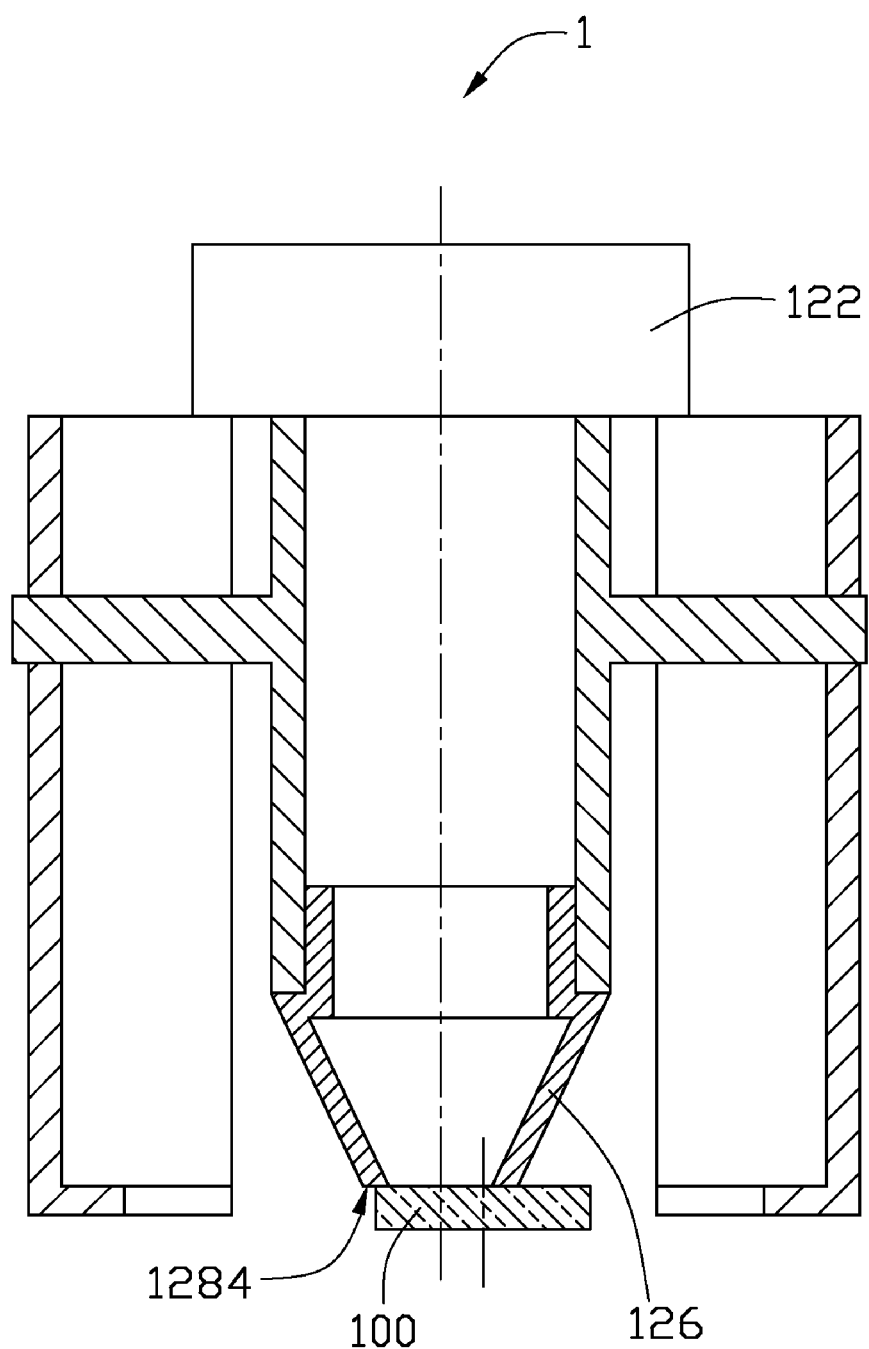
FIG. 3 is similar to FIG. 2, but showing an optical element being picked up by the apparatus.
Figure 4:
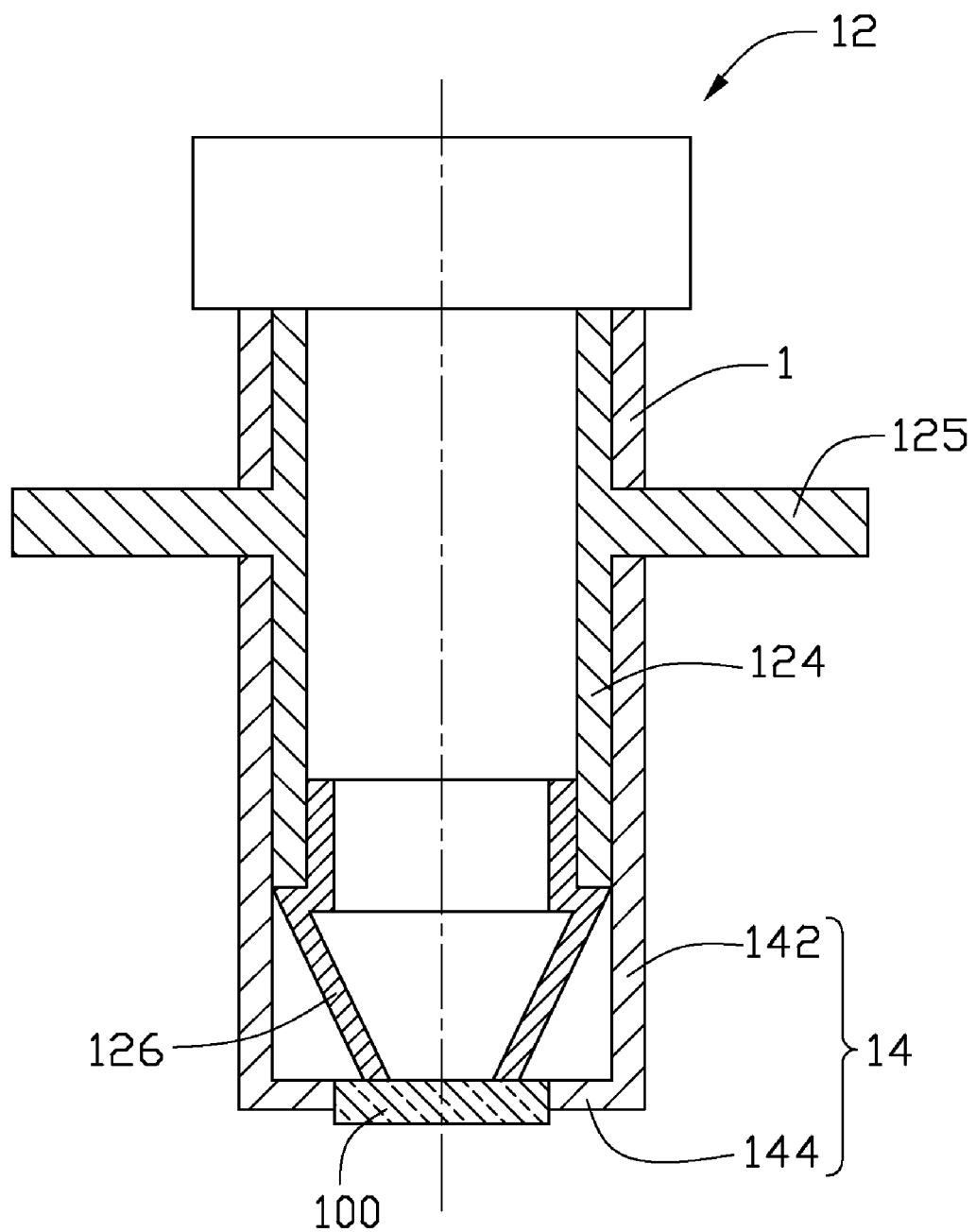
FIG. 4 is similar to FIG. 3, but showing position of the optical element being adjusted by the apparatus.

In operation, referring to FIG. 3, when the suction pump 122 works and the grasping surface 1284 is in contact with an optical element, e.g. a lens 100, the suction nozzle 126 can pick up the lens 100 readily. The lens 100 may be not coaxial with the suction nozzle 126. Referring to FIG. 4, the two positioning members 14 can move face to face along the axes of the guiding poles 125, until the two positioning members 14 are in contact with each other and are both in contact with the suction pipe 124. Then the recesses 1440 of the guiding portions 144 can constitute a receiving space to fittingly receive the lens 100. During the motion of the two positioning members 14, the lens 100 is moved to a predetermined fixed position relative to the suction device 12, that is, the lens 100 is guided by one of the guiding portions 144 to be fittingly received in the receiving space. Because the two positioning members 14 are equidistantly spaced from a central axis of the suction device 12, the lens 100 is guided by the positioning members 14 to be coaxial with the suction device 12.

Figure 5:
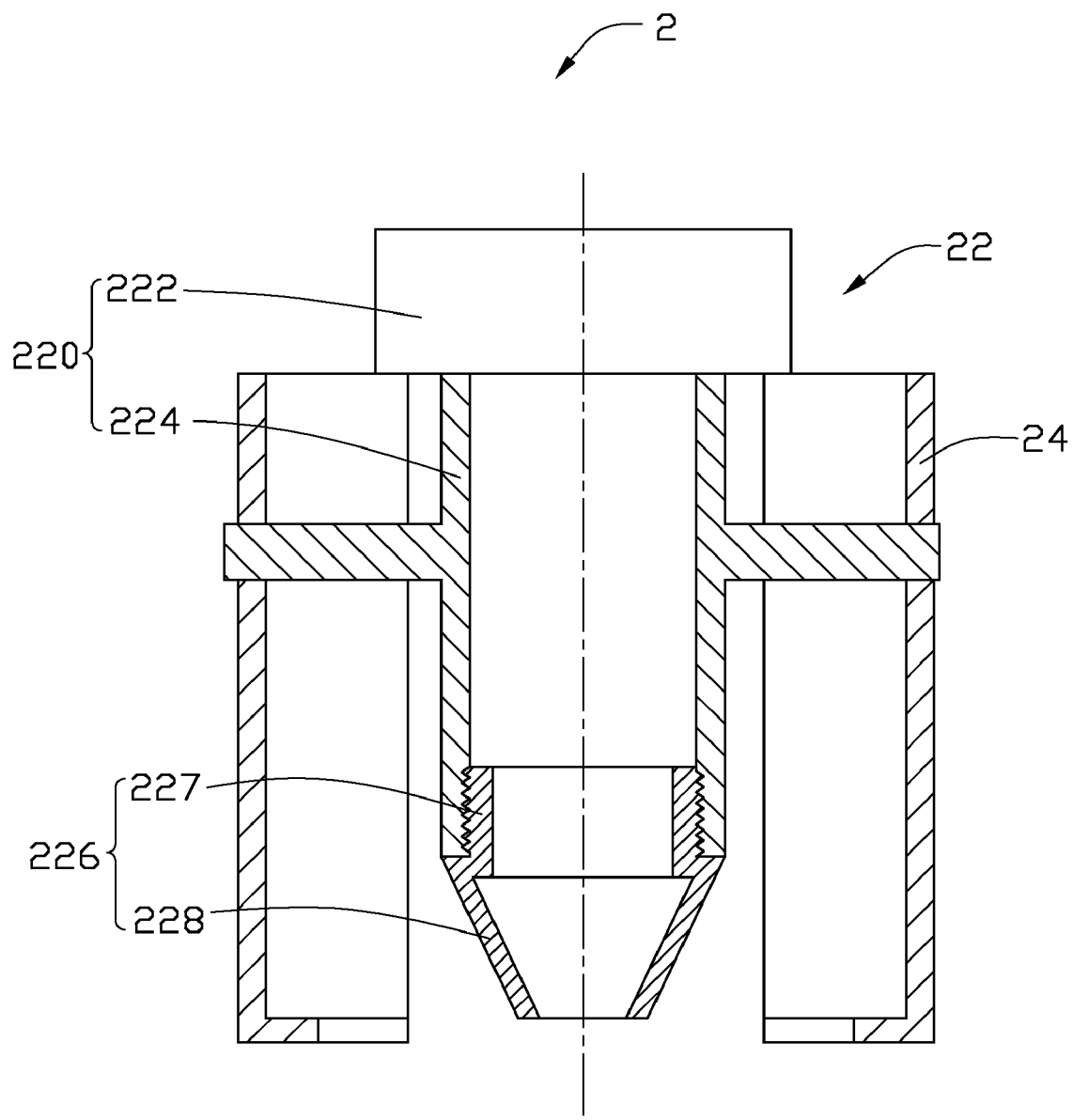
FIG. 5 is a schematic view of an apparatus, in accordance with a second embodiment.

Referring to FIG. 5, an apparatus 2 in accordance with a second embodiment is shown. The apparatus 2 also includes a suction device 22 and two positioning members 24. The suction device 22 also includes a suction body 220 and a suction nozzle 226. The suction body 220 also includes a suction pump 222 and a suction pipe 224. The suction nozzle 226 also includes an engaging portion 227 and a grasping portion 228. Specifically, the suction pipe 224 defines internal screw threads therein, the engaging portion 227 defines corresponding external screw threads, and therefore, the engaging portion 227 can engage with the suction pipe 224 by the screw threads.

Figure 6:
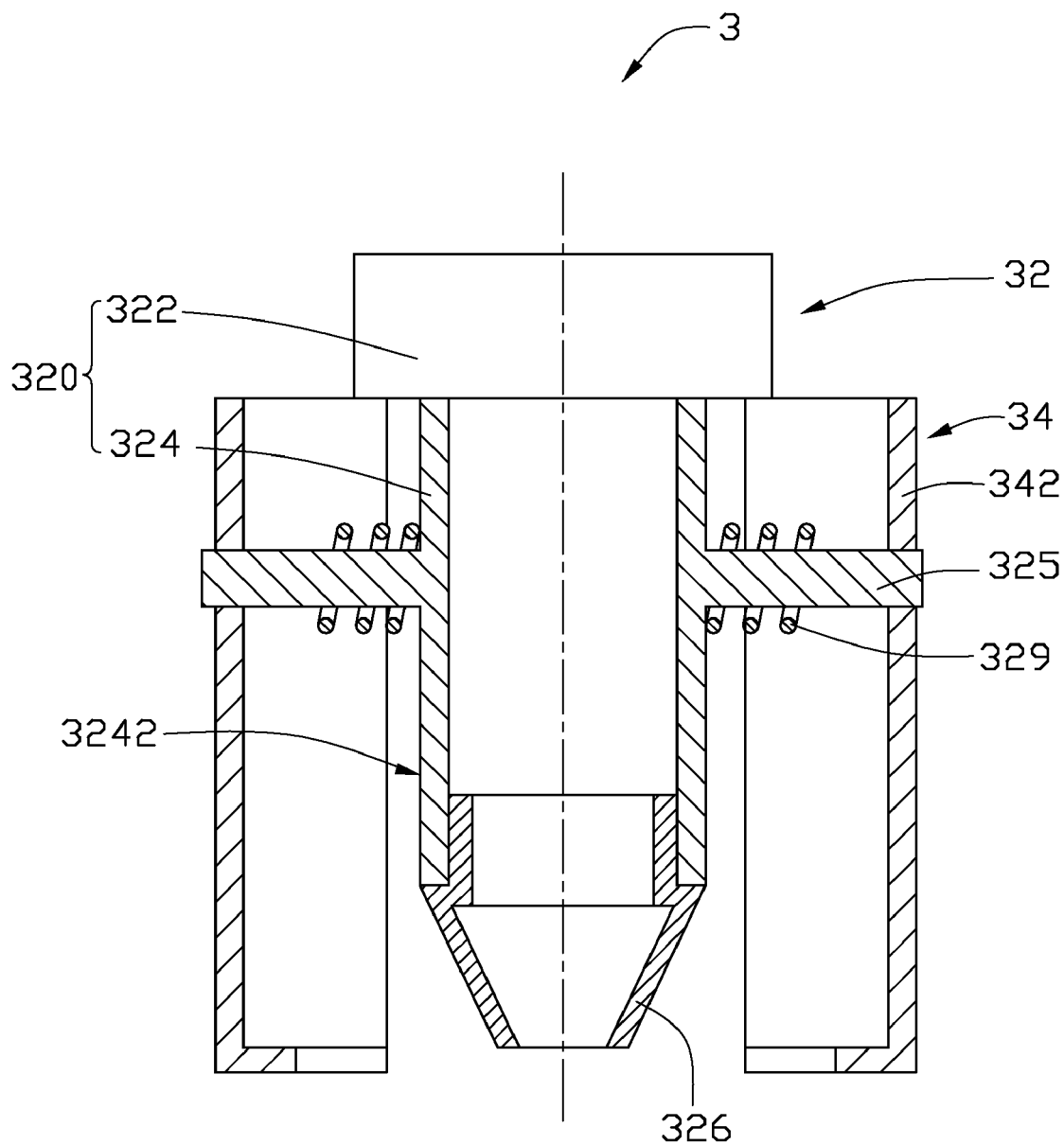
FIG. 6 is a schematic view of an apparatus, in accordance with a third embodiment.

Referring to FIG. 6, an apparatus 3 in accordance with a third embodiment is shown. The apparatus 3 also includes a suction device 32 and two positioning members 34. The suction device 32 also includes a suction body 320 and a suction nozzle 326. The suction body 320 also includes a suction pump 322 and a suction pipe 324. Two guiding poles 325 are defined at two opposite sides of an outer surface 3242 of the suction pipe 324. Each of the positioning members 34 also includes a main portion 342 and a guiding portion 344. Specifically, two springs 329 are disposed between the suction pipe 324 and the main portions 342, surrounding the two guiding poles 325, respectively. In other words, the two springs 329 are sleeved on ends adjacent to the suction pipe 324 of the guiding poles 325.

In operation, after the optical element being aligned with the suction device 32, the springs 329 can give the positioning members 34 elastic restoring forces to make the two positioning members 34 move far away from the suction device 32.

Compared with the conventional optical element-grasping member, the apparatus 1, 2, and 3 can pick up the optical element and adjust the position of the optical element to make the optical element coaxial with the apparatus 1, 2, and 3. Therefore, the coaxiality of the optical element and the lens barrel can be ensured. In addition, due to the suction nozzles 126, 226, and 326 are detachably mounted on the suction bodies 120, 220, and 320, respectively, such that suction nozzles having different sizes can be mounted on the suction bodies 120, 220, and 320, as practical need.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

The invention claimed is:

1. An apparatus for picking up an optical element, comprising:
 a suction device comprising a suction body, a suction nozzle, and two guiding poles, the suction nozzle detachably mounted on one end of the suction body, the suction body being in communication with the suction nozzle and being configured for providing an air pressure below atmospheric pressure to enable the suction nozzle to pick up the optical element by a suction force, and the two guiding poles extending from two opposite sides of the suction body; and
 two positioning members, the two positioning members each having a through hole corresponding to a respective one of the guiding poles and being mounted on the suction body by engagement of the guiding pole in the through hole, the two positioning members being movable face to face along the respective guiding poles, thereby moving close to each other to move the optical element picked up by the suction nozzle to a predetermined fixed position relative to the suction device.

2. The apparatus as claimed in claim 1, wherein the two positioning members are configured to move the optical element so as to coaxially align the optical element with the suction body.

3. The apparatus as claimed in claim 1, wherein the two positioning members are equidistantly spaced from a central axis of the suction device.

4. The apparatus as claimed in claim 1, wherein the suction body comprises a suction pump and a suction pipe in communication with the suction pump, the suction nozzle is detachably mounted on the suction pipe, and a cavity in communication with the suction pipe is defined in the suction nozzle.

5. The apparatus as claimed in claim 4, wherein the suction pipe is connected between the suction pump and the suction nozzle.

6. The apparatus as claimed in claim 4, wherein the suction nozzle comprises an engaging portion and a grasping portion connected with the engaging portion, the engaging portion is engaged with the suction pipe, and the grasping portion is configured for being in contact with the optical element.

7. The apparatus as claimed in claim 6, wherein the engaging portion and the suction pipe are engaged by interference fit.

8. The apparatus as claimed in claim 4, wherein the suction pump is a vacuum pump.

9. The apparatus as claimed in claim 1, wherein the two guiding poles extend along a direction perpendicular to a central axis of the suction device.

10. The apparatus as claimed in claim 1, wherein each of the positioning members comprises a main portion and a guiding portion extending from a distal end of the main portion, the through holes are defined in the main portions, and each of the guiding portions has a recess configured for fittingly receiving a half of the optical element.

11. The apparatus as claimed in claim 10, wherein the suction nozzle has a grasping surface configured for being in contact with the optical element, and a distance between the guiding portion and the through hole is equal to or greater than a distance between the grasping surface and the guiding poles.

12. The apparatus as claimed in claim 10, wherein the suction nozzle has a grasping surface configured for being in contact with the optical element, and the guiding portion is disposed at a position below the grasping surface.

13. The apparatus as claimed in claim 1, wherein two springs are disposed between the suction body and the positioning members, and each of the two springs surrounds an end of the corresponding guiding pole.

14. An apparatus for picking up an optical element, comprising:
a suction device comprising a suction body and a suction nozzle, the suction body being in communication with the suction nozzle, the suction body comprising a suction pump and a suction pipe in communication with the suction pump, the suction nozzle being detachably mounted on the suction pipe, and a cavity in communication with the suction pipe being defined in the suction nozzle, the suction nozzle comprising an engaging portion and a grasping portion connected with the engaging portion, the engaging portion of the suction nozzle being engaged with the suction pipe by interference fit, the grasping portion being configured for being in contact with the optical element, and the suction body being configured for providing an air pressure below atmospheric pressure to enable the suction nozzle to pick up the optical element by a suction force; and
two positioning members movably mounted on two opposite sides of the suction body, the two positioning members being movable towards each other and configured to move the optical element picked up by the suction nozzle to a predetermined fixed position relative to the suction device.

15. The apparatus as claimed in claim 14, wherein the two positioning members are configured to move the optical element so as to coaxially align the optical element with the suction body.

16. The apparatus as claimed in claim 14, wherein the two positioning members are equidistantly spaced from a central axis of the suction device.

17. An apparatus for picking up an optical element, comprising:
a suction device comprising a suction body, a suction nozzle, and two guiding poles, the suction nozzle detachably mounted on one end of the suction body, the suction body being in communication with the suction nozzle and being configured for providing an air pressure below atmospheric pressure to enable the suction nozzle to pick up the optical element by a suction force, the two guiding poles extending from two opposite sides of the suction body;
two positioning members movably mounted on two opposite sides of the suction body, each of the two positioning members having a through hole corresponding to one guiding pole and being mounted on the suction body by engagement of the guiding pole in the through hole, the two positioning members being movable towards each other and configured to move the optical element picked up by the suction nozzle to a predetermined fixed position relative to the suction device; and
two springs being disposed between the suction body and the positioning members, each spring surrounding an end of the corresponding guiding pole.

* * * * *